United States Patent
Chen et al.

(10) Patent No.: US 7,625,788 B2
(45) Date of Patent: Dec. 1, 2009

(54) DISPLAY ELEMENT AND METHOD OF MANUFACTURING THE SAME

(75) Inventors: Po-Lin Chen, Hsinchu (TW); Wen-Ching Tsai, Hsinchu (TW); Chun-Nan Lin, Hsinchu (TW); Kuo-Yuan Tu, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 12/115,855

(22) Filed: May 6, 2008

(65) Prior Publication Data

US 2009/0057668 A1 Mar. 5, 2009

(30) Foreign Application Priority Data

Aug. 29, 2007 (TW) ............... 96132084 A

(51) Int. Cl.
*H01L 21/00* (2006.01)
*H01L 21/44* (2006.01)
(52) U.S. Cl. ............... 438/158; 257/59; 257/E29.291; 257/E21.627; 257/57; 438/674; 438/678
(58) Field of Classification Search ............... 438/627, 438/678, 151–156; 257/57, 59
See application file for complete search history.

(56) References Cited

U.S. PATENT DOCUMENTS

| | | | |
|---|---|---|---|
| 5,356,756 A * | 10/1994 | Cavicchi et al. ............. | 430/315 |
| 6,218,221 B1 | 4/2001 | Sah | |
| 6,432,755 B2 | 8/2002 | Sung et al. | |
| 6,861,368 B2 * | 3/2005 | Chae ............... | 438/738 |
| 2002/0001887 A1 * | 1/2002 | Sung et al. ............... | 438/156 |
| 2008/0009108 A1 | 1/2008 | Lin et al. | |

FOREIGN PATENT DOCUMENTS

CN 1889272 1/2007

OTHER PUBLICATIONS

Yamashiro et al., Comparative Study of the Electroless Deposition of Nickel, 1986, Anales de la Asociacion Quimica Argentina, vol. 74, pp. 61-73.*
English language translation of abstract of CN 1889272, Pub. date: Jul. 28, 2006.

* cited by examiner

*Primary Examiner*—Ha Tran T Nguyen
*Assistant Examiner*—Aaron A Dehne
(74) *Attorney, Agent, or Firm*—Thomas, Kayden, Horstemeyer & Risley

(57) ABSTRACT

A display element and a method of manufacturing the same are provided. The method comprises the following steps: forming a first patterned conducting layer with a gate on a substrate and a dielectric layer thereon; forming a patterned semiconductor layer on the dielectric layer, wherein the patterned semiconductor layer has a channel region, a source and a drain, and wherein the source and the drain lie on the opposite sides of the channel region; selectively depositing a barrier layer, which only wraps the patterned semiconductor layer; forming a second patterned conducting layer on the barrier layer and above the source and the drain. In the display element manufactured by the method, the barrier layer only wraps the patterned semiconductor layer.

19 Claims, 5 Drawing Sheets

DISPLAY ELEMENT AND METHOD OF MANUFACTURING THE SAME

This application claims the benefit from the priority of Taiwan Patent Application No. 096132084 filed on Aug. 29, 2007, the disclosure of which is incorporated by reference herein in their entirety.

CROSS-REFERENCES TO RELATED APPLICATIONS

Not applicable.

BACKGROUND OF THE INVENTION

1. Field of the Invention

The present invention relates to a display element and a method of manufacturing the same. More particularly, the present invention relates to a thin-film transistor (TFT) comprising a copper electrode and a method of manufacturing the same; and especially relates to forming a barrier layer only onto the semiconductor layer of the transistor by using an electroless plating process with deposition selectivity.

2. Descriptions of the Related Art

As liquid crystal display (LCD) panels gradually increase in size, the resolution thereof needs to increase accordingly. As a result, aluminum has been gradually being replaced by copper as the conductive material in the manufacturing process of the LCD panels. This is because copper has many advantages over aluminum, such as a lower resistivity, a lower thermal expansion coefficient, a higher melting point, a higher thermal conductivity and a greater resistance to electro-migration. Therefore, copper conductors may lead to a display panel with a higher circuit density and a more superior imaging quality, and may also reduce the manufacturing cost thereof. As a result, the manufacturing process adopting copper conductors has become common and popular for large-sized high-resolution LCDs.

However, a number of problems still exist in the existing LCD manufacturing processes when copper is adopted as the conductive material. Some examples include: the inability to form a self-protective oxide layer, poor adhesion with the dielectric layer, a high diffusion coefficient in the semiconductor layer and the dielectric layer, and reaction with silicon at a low temperature which forms a silicide. All these problems may lead to the degradation of electrical performance of such conductors in the LCDs, thus causing an adverse impact on the quality of LCDs.

In order to alleviate such problems, copper is generally used in combination with a barrier layer in the art at present. For example, when copper is used as the source/drain electrode of a TFT, a barrier layer is typically disposed between the copper and a semiconductor layer to prevent an undesired diffusion effect due to the direct contact therebetween. Such a barrier layer is typically made of nickel (Ni), tantalum (Ta), titanium (Ti), molybdenum (Mo), chromium (Cr), tungsten (W), or an alloy thereof.

FIG. 1 depicts a schematic cross-sectional view of a conventional display element adopting such a combination. In this display element, a transistor region 111 and a capacitance region 113 are defined on a substrate 11. The transistor region 111 has a transistor structure formed therein, which comprises in sequence (from bottom to top): a gate 131, a dielectric layer 15, a patterned semiconductor layer 17, a patterned barrier layer 19, a source/drain electrode 211, a passivation layer 23, and a patterned pixel electrode 25. The patterned semiconductor layer 17 further comprises a channel layer 171 and a source/drain layer 173. The capacitance region 113 comprises in sequence from bottom to top a first conductor 133, a dielectric layer 15, a patterned barrier layer 19, a second conductor 213, a passivation layer 23, and a patterned pixel electrode 25. The gate 131 and the first conductor 133 are respectively a portion of a first patterned conducting layer 13, while the source/drain electrode 211 and the second conductor 213 are respectively a portion of a second patterned conducting layer 21. The second patterned conducting layer 21 is made of copper or its alloys, although other conductive metal materials such as aluminum may also be optionally used.

In the structure depicted in FIG. 1, as described above, a barrier layer 19 is formed between the source/drain electrode 211 made of copper and the semiconductor layer 17 for separation therebetween, which is accomplished by a usual deposition and followed with lithographic and etching processes. Although this may overcome the diffusion problem described above, the barrier layer 19, which typically has a much higher resistivity than the conducting layers 13, 21, will increase the overall resistance significantly. Actually, the barrier layer 19 is also formed in some unnecessary regions of the display element such as the region circled by the dashed line. However, due to the limitation of lithographic and etching processes or out of convenience, the presence of the barrier layer 19 in these unnecessary regions is typically unavoidable. Therefore, elimination of such an unnecessary dual-layer structure in these regions can prevent an unnecessary increase in the resistance, thereby improving the performance of the resulting transistor.

Additionally, when the lithographic and etching processes, especially a wet etching process is performed, differential electrochemical reactions, i.e. different etching rates, to copper and the barrier layer tend to occur, and resulting in an undercutting to the barrier layer 19 at the periphery of the second patterned conductor 213. Such an undercut may cause degradation of the electrical performance of the thin-film transistor (TFT) and render it difficult to control the width of the conductor.

Although the formation of a barrier layer under the copper electrode in the existing TFT manufacturing process may obviate the diffusion effect, it will unnecessarily cause an increased resistance and undercut the barrier layer. In view of this, it is highly desirable to provide a method for manufacturing a display element that can eliminate all of the problems mentioned above.

SUMMARY OF THE INVENTION

Through research, inventors have found that a barrier layer by using such as an electroless plating with selective deposition can be selectively formed to only wraps the semiconductor layer but not any other layers during the manufacturing of a TFT. As a result, improper increase of the overall resistance and the copper diffusion of the electrode are prevented. In particular, this invention relates to a selectively depositing process by using an electroless plating procedure in manufacturing a TFT. In other words, prior to the formation of a copper electrode, an electroless plating procedure is performed to selectively form a barrier layer that only wraps a semiconductor layer. In this way, a uniform barrier layer may be obtained without using any additional masks, thus eliminating the above problems.

Therefore, one object of this invention is to provide a method for manufacturing a display element structure, which comprises the following steps: sequentially forming a first patterned conducting layer and a dielectric layer on the substrate, wherein the first patterned conducting layer includes a gate while the dielectric layer covers the first patterned conducting layer; forming a patterned semiconductor layer on the dielectric layer, wherein the patterned semiconductor layer includes a channel region, a source and a drain, and wherein the source and the drain lie on the opposite sides of the channel region; selectively depositing a barrier layer which only wraps the source and the drain; and finally, forming a second patterned conducting layer covering portions of the barrier layer above the source and the drain.

Another object of this invention is to provide a method for manufacturing a display element structure, which comprises the following steps: sequentially forming a first patterned conducting layer and a dielectric layer on a substrate with a transistor region and a capacitance region defined therein, wherein the first patterned conducting layer includes a gate while the dielectric layer covers the first patterned conducting layer; forming a patterned semiconductor layer on the dielectric layer in the transistor region, wherein the patterned semiconductor layer includes a channel region, a source and a drain, and wherein the source and the drain lie on the opposite sides of the channel region; selectively depositing a barrier layer which only wraps the patterned semiconductor layer; forming a second patterned conducting layer covering portions of the barrier layer above the source and the drain as well as portions of the dielectric layer in the capacitance region; forming a patterned passivation layer on the substrate, which defines an opening for exposing the portion of the second patterned conducting layer above the drain; and finally, forming a pixel electrode on the portion of the patterned passivation layer and within the opening, which is electrically connected to the second patterned conducting layer above the drain.

Yet a further object of this invention is to provide a display element structure on a substrate. The display element structure comprises the following components: a gate disposed on the substrate; a dielectric layer covering the gate and the substrate; a patterned semiconductor layer disposed on the dielectric layer, wherein the patterned semiconductor layer includes a channel region above the gate as well as a source and a drain lying on opposite sides of the channel region; a barrier layer, which only wraps the source and the drain; and a second patterned conducting layer disposed on the barrier layer and the dielectric layer.

The detailed technology and preferred embodiments implemented for the present invention are described in the following paragraphs accompanying the appended drawings for people skilled in this field to well appreciate the features of the claimed invention.

DESCRIPTION OF THE PREFERRED EMBODIMENT

Figure 1:
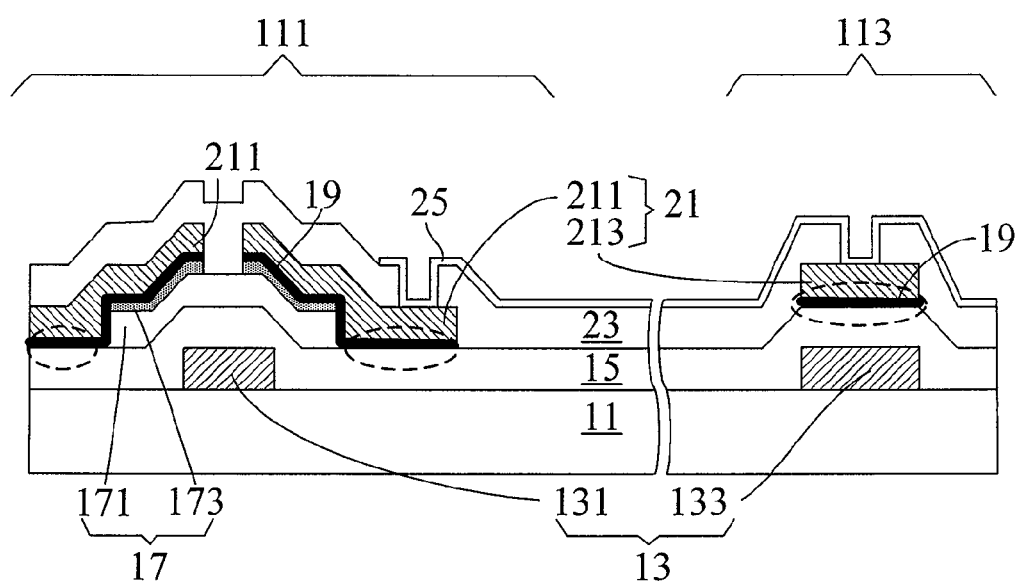
FIG. 1 is a schematic cross-sectional view of a conventional display element structure.
Figure 2A:
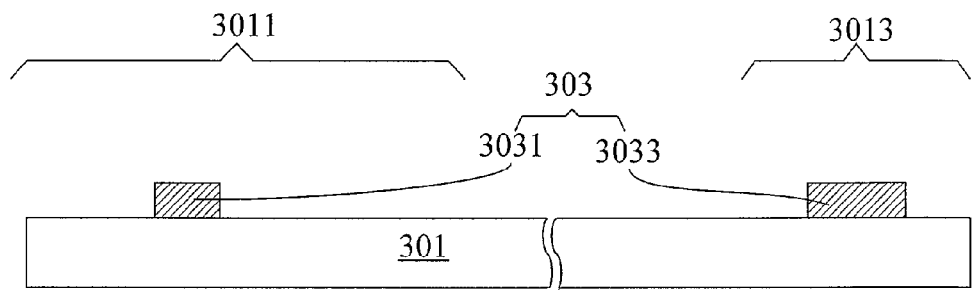
FIGS. 2A to 7 are schematic cross-sectional views of the present invention.

Initially, refer to FIG. 2A, a transistor region 3011 and a capacitance region 3013 are defined on a substrate 301. The substrate 301 is generally a glass substrate, but is not just limited thereto; optionally, a quartz substrate, a polymer substrate or other transparent substrates may also be used. Then, a conducting layer is formed on the substrate 301 by a suitable process such as a sputtering process to deposit thereon. The conducting layer can be made of copper or its alloys, but other suitable conductive metal materials such as aluminum may also be optionally used. Subsequently, a lithographic process and an etching process are utilized to pattern the conducting layer into a first patterned conducting layer 303, which comprises a gate 3031 located in the transistor region 3011 and a first conductor 3033 located in the capacitance region 3013.

Figure 2B:
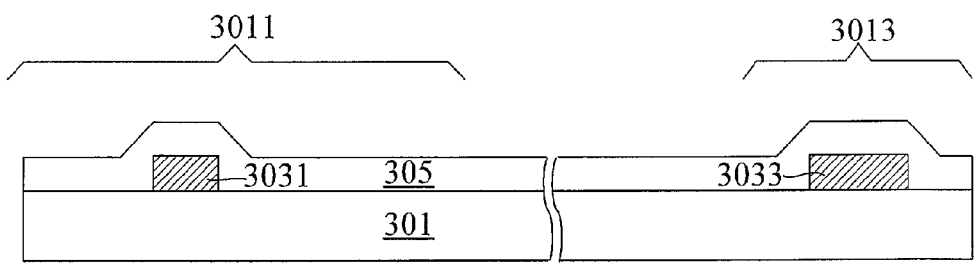

Next, refer to FIG. 2B a dielectric layer 305 is formed by any suitable conventional deposit processes (e.g., a chemical vapor deposition (CVD) process) to cover the first patterned conducting layer 303. The dielectric layer 305 may be made of silicon nitride. However, a silicon oxide layer, a composite layer of silicon nitride and silicon oxide, or other suitable dielectric layers may also be used.

Figure 3:
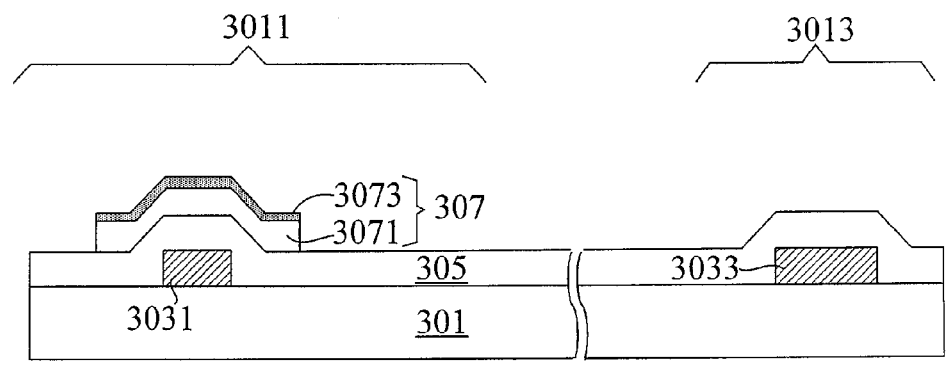

Next, a patterned semiconductor layer 307 is formed at a predetermined transistor location on the dielectric layer 305. Specifically, refer to FIG. 3, a channel layer 3071 and a source/drain layer 3073 are formed in sequence on the dielectric layer 305 by using any suitable conventional deposition processes (e.g., a CVD process). Generally, the channel layer 3071 can be an amorphous silicon layer, while the source/drain layer 3073 can be a doped amorphous silicon layer, for example, an N+ doped amorphous silicon layer. Next, lithographic and etching processes are performed to pattern the channel layer 3071 and the source/drain layer 3073 to form a patterned semiconductor layer 307 on the predetermined transistor location. Typically, the resulting channel layer 3071 will become a channel region on the gate of the transistor, while the resulting source/drain layer 3073 will provide a source and a drain located at opposite sides of the channel region.

Figure 4:
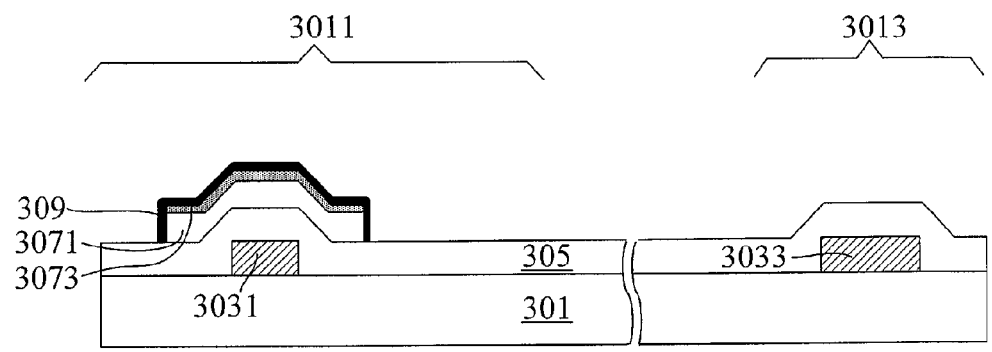

Subsequently, refer to FIG. 4, a selectively depositing process is performed to selectively form a barrier layer 309, which only wraps or covers the patterned semiconductor layer 307. The barrier layer 309 is typically made of a metal, which may be a material selected from a group consisting of nickel (Ni), Chromium (Cr), cobalt (Co), manganese (Mn), niobium (Nb), Ruthenium (Ru), tantalum (Ta), titanium (Ti), molybdenum (Mo), tungsten (W), gold (Au), silver (Ag), other transition metals and a combination thereof. The selective depositing process may be for example an electroless plating process or other electrochemical plating process.

The electroless plating process is, in short, a kind of chemical plating method, which does not need a current but rather utilizes electric charges released from the oxidation of a reductant agent in an electroplating solution. These electric charges are supplied to the surrounding metal ions, so that the metal ions will be reduced to deposit on a target surface with a catalytic effect or a seed crystallized effect. As the target surface catalyzes the electroless plating reaction, the metal adheres on the target surface to form a metal layer, which in turn serves to catalyze the reductive deposition of the next layer of metal. Consequently, the thickness of the metal layer builds up gradually to finally result in a uniform and compact metal layer. Generally, a suitable electroplating solution may be selected for the electroless plating process depending on the metal to be formed, so that the metal will be only deposited on the surface of a particular material. It can be seen that the electroless plating process features deposition selectivity, i.e., the metal is only deposited on a surface with a catalytic effect or a seed crystallized effect. By forming a barrier layer using such a characteristic, the conventional problems of lithographic and etching process can be eliminated.

An example of forming a nickel barrier layer on a patterned semiconductor layer by using an electroless plating process will be described hereinafter. In this illustrative electroless plating process, a nickel-containing electroplating solution may be used, for example, a $NiSO_4$ containing solution. The electroplating solution should preferably comprise 0.01 to 0.1 M of $NiSO_4.6H_2O$, 0.01 to 0.5 M of $NH_4Cl$, 1 to 20 wt % (weight percentage) of $N_2H_4$, and 0.5 to 5.0 wt % of $NH_4OH$. The electroplating solution used for the electroless nickel plating process may comprise 0.03 M of $NiSO_4.6H_2O$, 0.1 M of $NH_4Cl$, 30 wt % of $N_2H_4$, and 1.4 wt % of $NH_4OH$. In the electroless plating process of this embodiment, nickel is substantially only formed on the patterned semiconductor layer 307, which has silicon-silicon bonds, but not on the dielectric layer 305 which has silicon-nitrogen bonds. As a result, the nickel barrier layer will only wrap the patterned semiconductor layer 307. The barrier layer thus formed is uniform and compact, and has a thickness typically in the range from 10 to 800 nm.

Figure 5A:
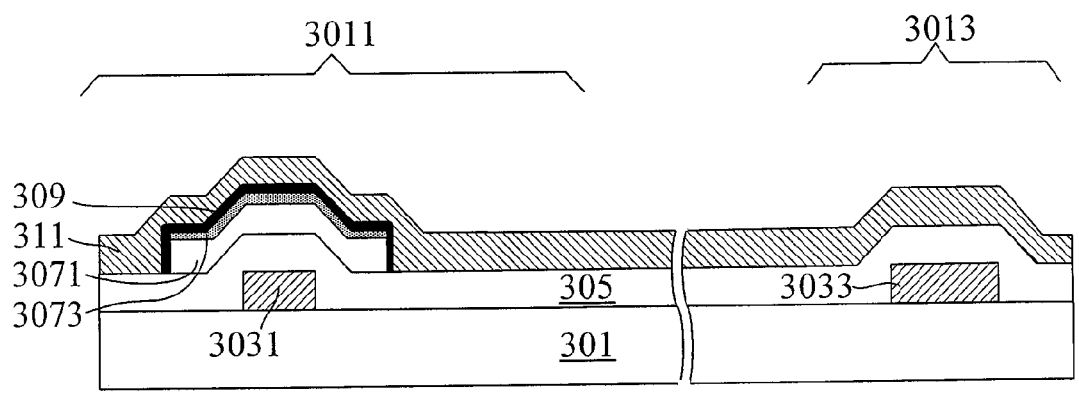

Next, refer to FIG. 5A, a second conducting layer 311 is deposited on the substrate 301 using a suitable process such as sputtering. A suitable material for the second conducting layer 311 can be copper and its alloys, but aluminum or other conductive metals may also be optionally used. Subsequently, refer to FIG. 5B, lithographic and etching processes are performed to pattern the second conducting layer 311 into a second patterned conducting layer 313, which comprises a source electrode 3131 and a drain electrode 3133 in the transistor region 3011 as well as the second conductor 3135 in the capacitance region 3013. Specifically, a portion of both the doped amorphous silicon layer 3073 and the barrier layer 309 above the gate 3031 in the transistor region 3011 are simultaneously removed in the etching process. The removal of these portions may be accomplished by using a wet etching or a dry etching process. As a result, in the transistor region 3011, the second patterned conducting layer 313 remains on the barrier layer 309 above the patterned semiconductor layer 307 (i.e., on the barrier layer 309 above the source and the drain), to serve as the source electrode 3131 and the drain electrode 3133 electrically connected with the source and the drain respectively. Correspondingly, in the capacitance region 3013, the second patterned conducting layer 313 remains on the dielectric layer 305 above the first conductor 3033 as a second conductor 3135.

Figure 5B:
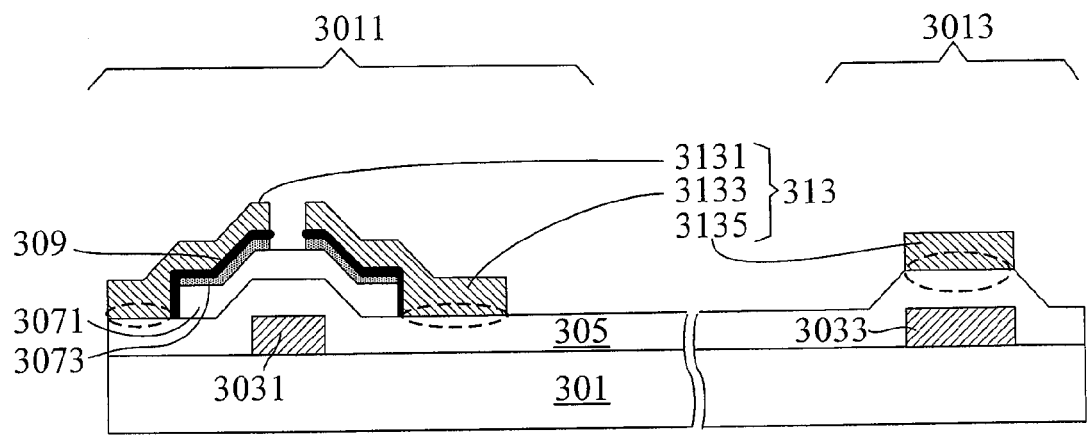

It can be seen from FIG. 5B that a barrier layer 309 may be selectively formed only around the semiconductor layer 307 by using an electroless plating process without any additional masks, i.e., the barrier layer 309 only wraps the semiconductor layer 307. Additionally, since the electroless plating process only forms a barrier layer 309 around the patterned semiconductor layer 307, the barrier layer 309 only exists between the patterned semiconductor layer 307 and the source electrode 3131/the drain electrode 3133. That is, the barrier layer 309 only exists underneath a portion of the second patterned conducting layer 313 above the patterned semiconductor layer 307, and not underneath other portions of the second patterned conducting layer 313, as shown by the dashed lines in FIG. 5B. This may not only reduces the exposed interface between the second patterned conducting layer 313 and the barrier layer 309, but also reduces the regions where the dual-layer structure of the second patterned conducting layer 313 and the barrier layer 309 exists, thus, eliminating unnecessary resistance and improving the overall performance of the transistor.

Figure 6:
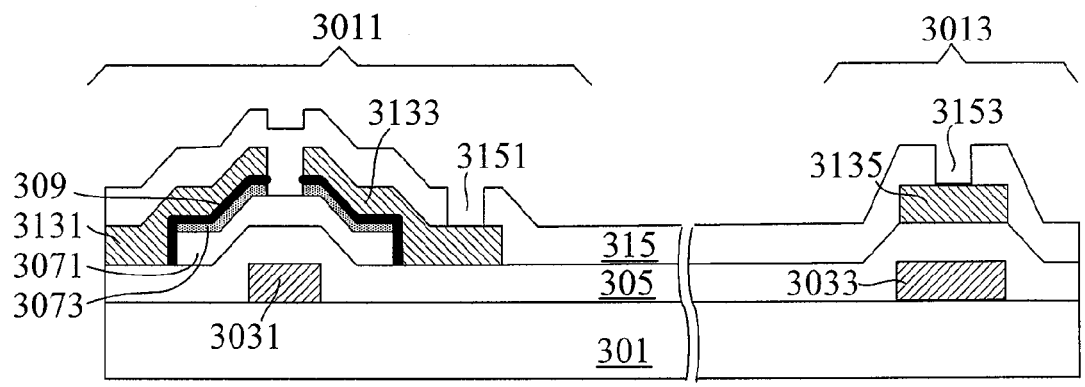

Next, refer to FIG. 6, a patterned passivation layer 315 is formed above the substrate 301. The patterned passivation layer 315 has a first opening 3151 exposing a portion of the drain electrode 3133 and a second opening 3153 exposing a portion of the second conductor 3135. The patterned passivation layer 315 is typically made of silicon nitride, but a silicon oxide layer, a composite layer of silicon nitride and silicon oxide, or other suitable dielectric layers may also be used.

Figure 7:
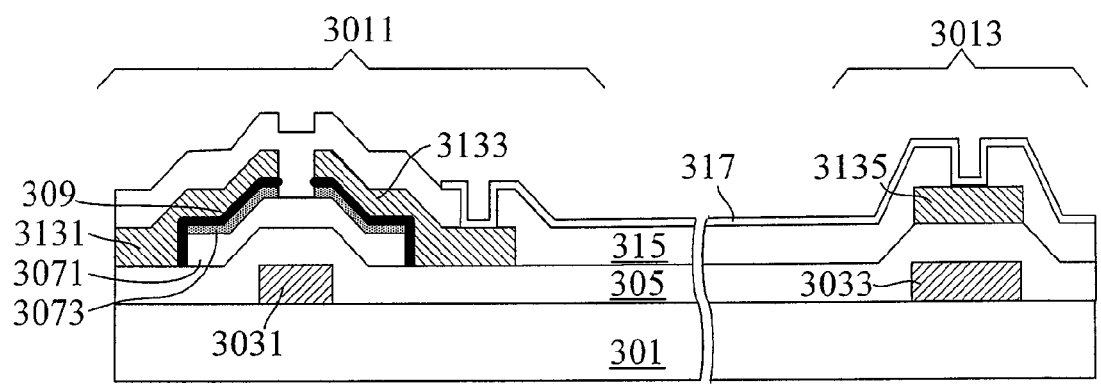

Finally, refer to FIG. 7, a pixel electrode 317 is formed on a portion of the patterned passivation layer 315 and within the openings 3151, 3153 for electrical connection to the drain electrode 3133 and the second conductor 3135.

In summary, according to the invention, a uniform and compact barrier layer can be formed only on the semiconductor layer by using a selective deposition process. As an electroless plating process, the selective deposition does not require any additional masks. Thus, conventional problems of manufacturing a transistor are eliminated by using the present invention. That is, the undercutting of the barrier layer is eliminated, thus preventing the degradation of the transistor and allows control of the conductor width. In addition the resistance attributed to the dual-layer structure comprised of the conducting layer and the barrier layer is maintained.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method of manufacturing a display element structure, comprising:
    providing a substrate;
    sequentially forming a first patterned conducting layer and a dielectric layer on the substrate, wherein the first patterned conducting layer includes a gate and the dielectric layer covers the first patterned conducting layer;
    forming a patterned semiconductor layer on the dielectric layer, wherein the patterned semiconductor layer includes a channel region, and a source and a drain lied on the opposite sides of the channel region;
    selectively depositing a barrier layer, which is only formed on the patterned semiconductor layer, but not on the dielectric layer; and
    forming a second patterned conducting layer covering portions of the barrier layer above the source and the drain and covering portions of the dielectric layer adjacent to the source and the drain.

2. The method as claimed in claim 1, wherein a material of the barrier layer is selected from a group consisting of Ni, Cr, Go, Mn, Nb, Ru, Ta, Ti, Mo, W, Au, Ag, other transition metals and a combination thereof.

3. The method as claimed in claim 1, wherein the step of selectively depositing includes performing an electroless plating.

4. The method as claimed in claim 3, wherein the electroless plating is performed with a nickel-containing electroplating solution.

5. The method as claimed in claim 4, wherein the electroplating solution comprises 0.01 to 0.1 M of $NiSO_4.6H_2O$, 0.01 to 0.5 M of $NH_4Cl$, 1 to 20 wt % of $N_2H_4$, and 0.5 to 5.0 wt % of $NH_4OH$.

6. The method as claimed in claim 1, wherein a material of the second patterned conducting layer comprises Cu or an alloy thereof.

7. The method as claimed in claim 1, wherein a material of the second patterned conducting layer comprises Al or an alloy thereof.

8. The method as claimed in claim 1, wherein the patterned semiconductor layer in the channel region includes an amorphous silicon layer.

9. The method as claimed in claim 1, wherein the patterned semiconductor layer in each of the source and drain includes a doped amorphous silicon layer.

10. The method as claimed in claim 9, wherein the doped amorphous silicon layer includes an N+ doped amorphous silicon layer.

11. The method as claimed in claim 1, wherein the barrier layer has a thickness in the range from 10 to 800 nm.

12. A method of manufacturing a display element structure, comprising:
   providing a substrate with a transistor region and a capacitance region;
   sequentially forming a first patterned conducting layer and a dielectric layer on the substrate, wherein the first patterned conducting layer includes a gate and the dielectric layer covers the first patterned conducting layer;
   forming a patterned semiconductor layer on the dielectric layer, wherein the patterned semiconductor layer includes a channel region, and a source and a drain lied on the opposite sides of the channel region;
   selectively depositing a barrier layer, which is only formed on the patterned semiconductor layer, but not on the dielectric layer;
   forming a second patterned conducting layer covering portions of the barrier layer above the source and the drain and portions of the dielectric layer adjacent to the source and the drain, and covering a portion of the dielectric layer in the capacitance region;
   forming a patterned passivation layer on the substrate, which defines an opening for exposing the portion of the second patterned conducting layer above the drain; and
   forming a pixel electrode on a portion of the patterned passivation layer and within the opening, which is electrically connected to the second patterned conducting layer above the drain.

13. The method as claimed in claim 12, wherein the step of selectively depositing includes performing an electroless plating.

14. The method as claimed in claim 13, wherein the electroless plating is performed with an electroplating solution containing a material selected from a group consisting of Ni, Cr, Go, Mn, Nb, Ru, Ta, Ti, Mo, W, Au, Ag, other transition metals and a combination thereof.

15. The method as claimed in claim 13, wherein the electroless plating is performed with a nickel-containing electroplating solution.

16. The method as claimed in claim 15, wherein the electroplating solution contains 0.01 to 0.1 M of $NiSO_4.6H_2O$, 0.01 to 0.5 M of $NH_4Cl$, 1 to 20 wt % of $N_2H_4$, and 0.5 to 5.0 wt % of $NH_4OH$.

17. The method as claimed in claim 12, wherein a material of the second patterned conducting layer comprises Cu or an alloy thereof.

18. The method as claimed in claim 12, wherein a material of the second patterned conducting layer comprises Al and an alloy thereof.

19. The method as claimed in claim 12, wherein the barrier layer has a thickness in the range from 10 to 800 nm.

* * * * *